United States Patent [19]

Chance et al.

[11] Patent Number: 5,155,577

[45] Date of Patent: Oct. 13, 1992

[54] INTEGRATED CIRCUIT CARRIERS AND A METHOD FOR MAKING ENGINEERING CHANGES IN SAID CARRIERS

[75] Inventors: Dudley A. Chance, Newton, Conn.; Timothy R. Dinger, Croton-on-Hudson, N.Y.; David P. Lapotin, Carmel, N.Y.; Walter V. Vilkelis, Poughkeepsie, N.Y.

[73] Assignee: International Business Machines Corporation, Armonk, N.Y.

[21] Appl. No.: 638,305

[22] Filed: Jan. 7, 1991

[51] Int. Cl.⁵ ............... H01L 23/48; H01L 29/46; H01L 29/44; H01L 29/52

[52] U.S. Cl. ..................... 357/71; 357/68; 361/414; 361/409

[58] Field of Search ............ 357/71, 74, 65, 68; 361/414, 409, 410

[56] References Cited

U.S. PATENT DOCUMENTS

| | | | |
|---|---|---|---|
| 4,245,273 | 1/1981 | Feinberg et al. | 361/382 |
| 4,254,445 | 3/1981 | Ho | 361/392 |
| 4,322,778 | 3/1982 | Barbour et al. | 361/414 |
| 4,489,364 | 12/1984 | Chance et al. | 361/395 |
| 4,549,200 | 10/1985 | Ecker et al. | 357/80 |
| 4,631,100 | 12/1986 | Pellegrino | 156/150 |
| 4,652,974 | 3/1987 | Ryan | 361/395 |
| 4,706,165 | 11/1987 | Takenaka et al. | 361/403 |
| 4,720,915 | 1/1988 | Kennedy et al. | 29/847 |
| 4,840,924 | 6/1989 | Kinbara | 437/189 |
| 4,912,603 | 3/1990 | Seyama | 361/409 |

Primary Examiner—Jerome Jackson, Jr.
Assistant Examiner—D. Monin
Attorney, Agent, or Firm—Scully, Scott, Murphy & Presser

[57] ABSTRACT

An integrated circuit carrier comprising a modular substrate having an upper surface, a multitude of electrically conducting device terminals on the upper surface of the substrate, a multitude of electrically conducting engineering change pads also on the upper surface of the substrate, and an engineering change network to form a unique electrical connection between each of an arbitrary subset of the device terminals and each of an arbitrary subset of the engineering change pads. The engineering change network includes a multitude of connecting pads, and a multitude of first, second, and third conductive leads or wires, and each of the connecting pads includes first and second spaced apart sections.

16 Claims, 7 Drawing Sheets

INTEGRATED CIRCUIT CARRIERS AND A METHOD FOR MAKING ENGINEERING CHANGES IN SAID CARRIERS

BACKGROUND OF THE INVENTION

This invention generally relates to integrated circuit device carriers, commonly known as packages, on which devices can be bonded for electrical contact and mechanical support. More particularly, the invention relates to the technique of and structure for making engineering changes in such carriers to alter the original circuit designs of the carriers or to correct wiring defects.

In modern integrated circuit packaging technology, many integrated circuit devices may be mounted on a substrate containing a printed circuit network that interconnects the devices with each other and to input and output terminals on the substrate. Such substrates, normally made of ceramic material, are very complex, containing 30 or more layers of ceramic sheets. Typically, the internal printed circuit network of the substrate is comprised of a multitude of lines or traces on a given layer, and a multitude of connectors or small connecting assemblies, between the layers. These connectors or connecting assemblies are referred to as vias.

The lines or traces of the network extend internally of the substrate, in one or more planes parallel to a top surface of the substrate; and the vias are electrically connected to these internal lines or traces and extend upward therefrom to the top surface of the substrate, thereby providing access to the internal circuit network. Even more specifically, the internal lines or traces of the network are comprised of the first set of parallel conductive lines that extend in a first direction, referred to as the X direction, and a second set of parallel conductive lines that extend in a second direction perpendicular to the above-mentioned first direction, and referred to as the y direction.

After the substrate has been laminated and sintered, there is no practical way of changing the buried internal network. However, it often becomes necessary to modify the circuit design of the substrate, either to correct defective lines or vias, or to make changes to the basic circuitry. Such basic changes may be appropriate to accommodate changes in the integrated circuit devices carried on the substrate, to upgrade the substrate or to modify it for use with different circuit devices.

The changes needed to modify the internal circuit network of a substrate or carrier are referred to as engineering changes; and the contingency that such changes may be needed is typically provided for by the use of engineering change pads, which are small, electrically conductive locations on the top surface of the substrate of the carrier. Engineering change pads surround each integrated circuit device mounted on the substrate, and a respective one engineering change pad is associated with each signal (logic) terminal of each circuit device carried on the substrate. Fan out metallurgy is normally provided on the top surface or on the top layers of the substrate to connect each integrated circuit device terminal with the associated engineering change pad, and each engineering change pad is also connected to buried circuitry in the substrate, to thereby connect the associated circuit device terminal with other circuit devices and/or input/output terminal on the substrate.

To bypass a defective line or trace buried in the substrate, or to otherwise modify the internal circuitry of the substrate, an engineering change pad is cut or severed to electrically disconnect that engineering change pad, and the associated circuit device terminal, from the internal circuitry inside the substrate. One end of a wire is then joined to the portion of the engineering change pad still electrically connected to the associated circuit device terminal. The other end of the wire is then joined to a second engineering change pad that had been similarly cut or severed, thereby electrically connecting the first circuit device terminal to a second terminal or to the internal circuitry connected to the second engineering change pad. The same basic technique can be used to substitute for defective electric lines in a substrate and to change the internal electric network of the substrate.

While the engineering change technique described above works well, there are some disadvantages. For example, in order to accommodate the necessary wire bonding, the engineering change pads are relatively large, compared to the terminals of the integrated circuit devices carried by the substrate, and thus the engineering change pads occupy a great deal of space on the top surface of the substrate. As integrated circuit devices become smaller, more such devices can be mounted on a given area on a substrate surface. When this is done, there is a corresponding increase in the number of device logic terminals in a given area on the substrate. The additional device terminals require additional engineering change pads; and with the size of the engineering change pads constrained to accommodate wire bonding, the total area required by the engineering change pads increases dramatically. Indeed, for an integrated circuit device carrier having a high density of device logic terminals, there simply is not enough room on the carrier to provide one engineering change pad for each circuit device terminal.

SUMMARY OF THE INVENTION

An object of this invention is to provide a new and improved method and structure for modifying an inaccessible circuit network in a modular substrate that supports and interconnects a multitude of integrated circuit devices.

Another object of the present invention is to provide an engineering change technique for making circuit changes in a carrier for a multitude of integrated circuit devices, where the number of engineering change pads is less than the number of device logic terminals on the carrier.

A further object of the present invention is to provide a unique pathway between each of a multitude of device logic terminals on a carrier for integrated circuit devices and each of a multitude of engineering change pads on the carrier, thereby allowing each of an arbitrary subset of the terminals to be connected to a respective one of the engineering change pads even though the number of engineering change pads is less than the number of device terminals.

Another object of this invention is to provide a carrier for integrated circuit devices in which, in comparison to conventional circuit carriers, more joints and less deletes are performed to effect an engineering change.

These and other objectives are obtained with an integrated circuit carrier comprising a modular substrate having an upper surface, a multitude of electrically conducting device terminals on the upper surface of the substrate, a multitude of electrically conducting engineering change pads also on the upper surface of the substrate, and an engineering change network to form a unique electrical connection between each of an arbitrary subset of the device terminals and each of an arbitrary subset of the engineering change pads. Preferably, the engineering change network includes a multitude of connecting pads, and a multitude of first, second, and third conductive leads or wires, and each of the connecting pads includes first and second spaced apart sections.

Each device terminal is connected to the first section of a respective one connecting pad by one of the first leads; and the second section of each connecting pad is connected to one of the engineering change pads by a respective one of the second leads, and to another of the engineering change pads by a respective one of the third leads. Each engineering change pad includes a main bonding area and a multitude of inlet terminals; and each inlet terminal of each engineering change pad is connected to one of the connecting pads by a respective one of the second leads, and to another of the connecting pads by a respective one of the third leads. This engineering change network can be used to form a multitude of pathways to connect each of a multitude of adjacent device terminals to a respective one engineering change pad despite the fact that there are fewer engineering change pads than device terminals.

Further benefits and advantages of the invention will become apparent from a consideration of the following detailed description given with reference to the accompanying drawings, which specify and show preferred embodiments of the invention.

DETAILED DESCRIPTION OF THE PREFERRED EMBODIMENTS

Figure 1:
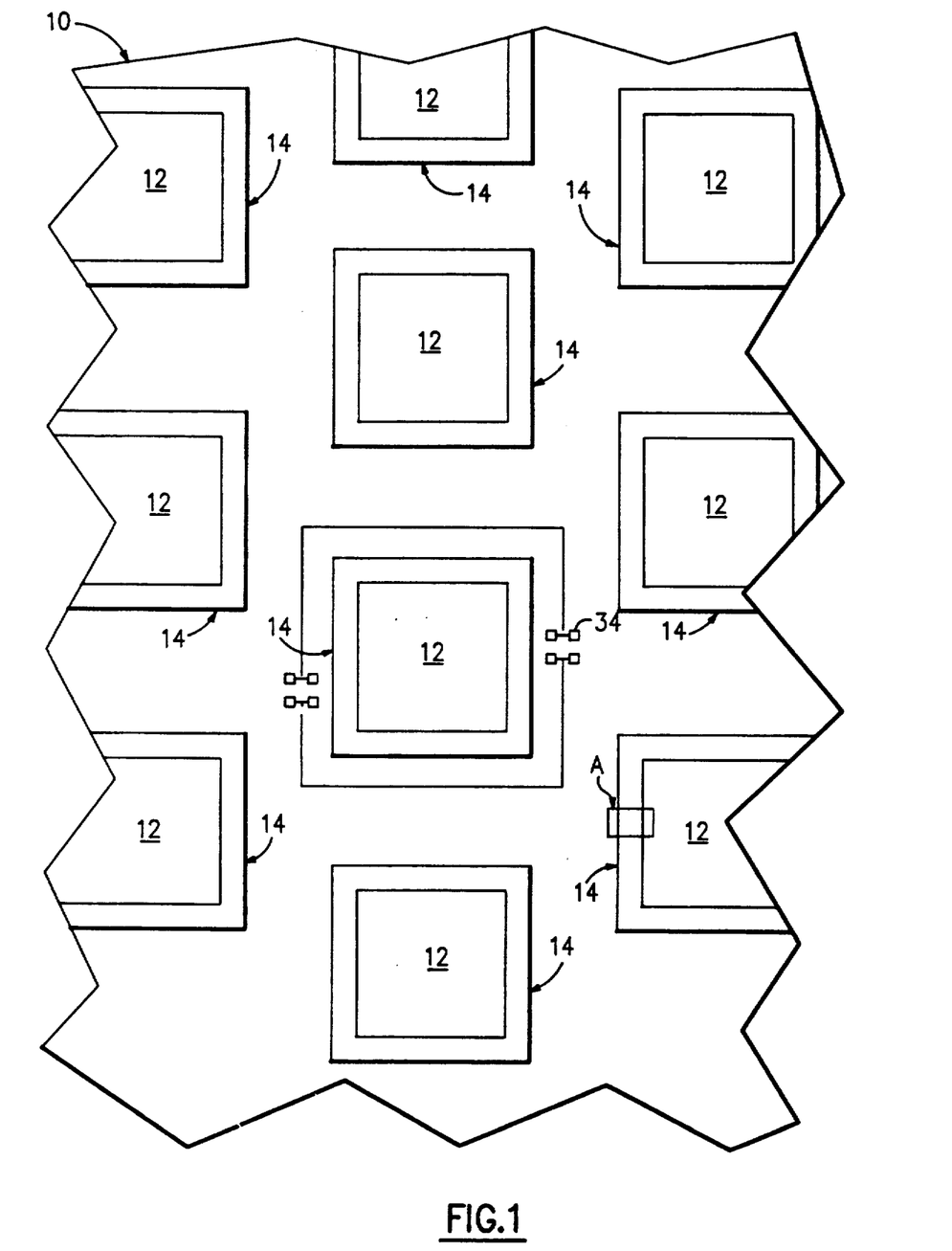
FIG. 1 is a partial, top plan view of a modular carrier for integrated circuit devices, in accordance with the present invention.
Figure 2:
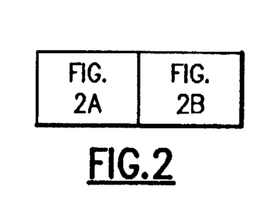
FIG. 2 is an enlarged view of the portion of FIG. 1 designated at A, and showing a multitude of engineering change pads, a multitude of device terminals, and a network interconnecting the engineering change pads and the device terminals.
Figure 2A:
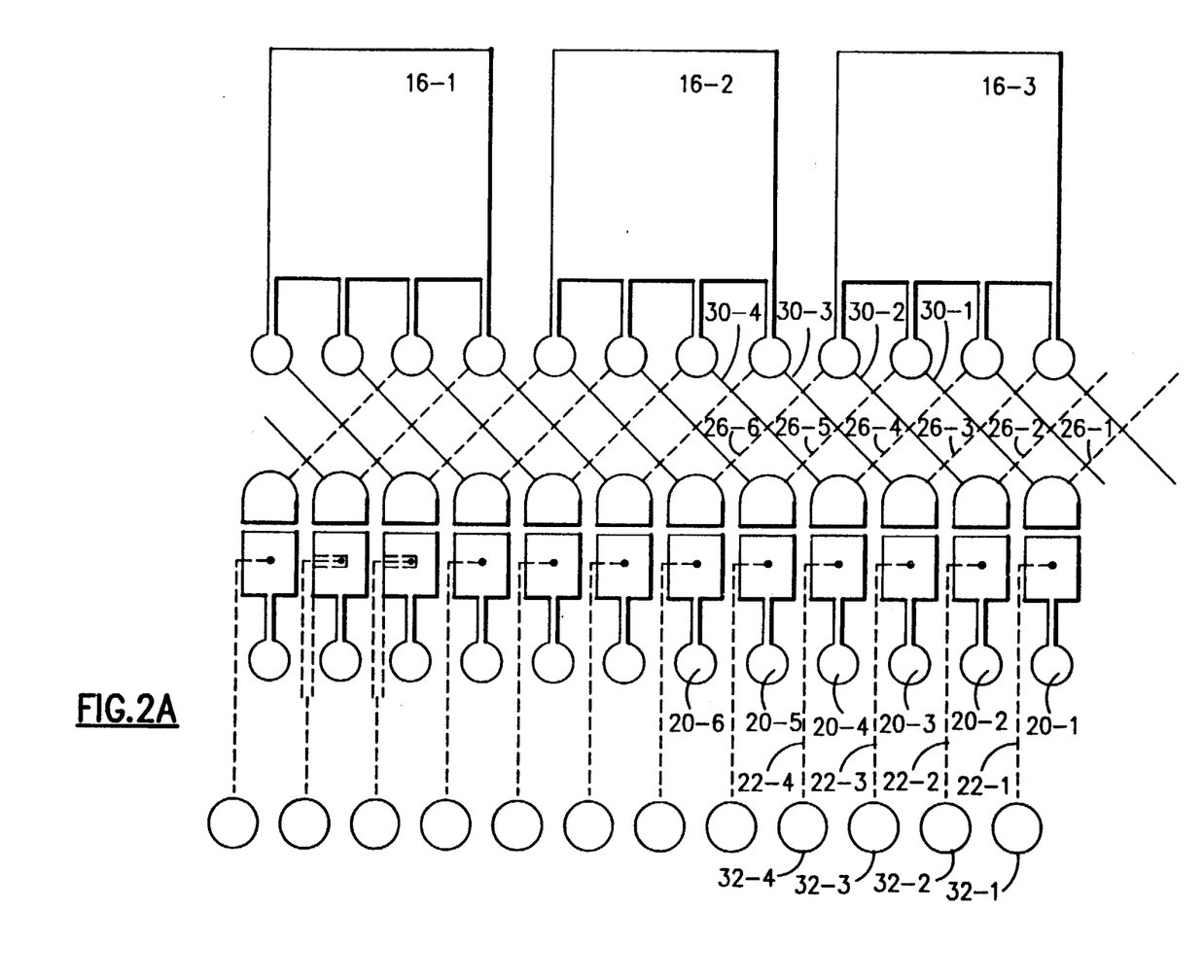
Figure 2B:
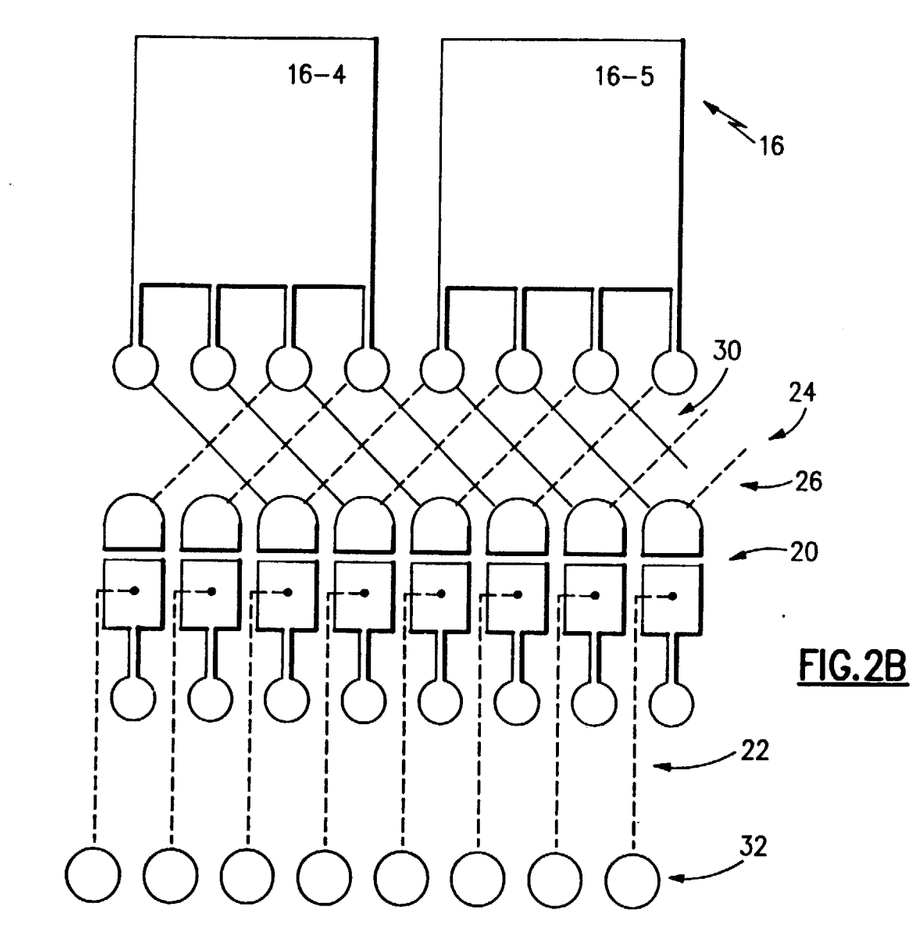

FIG. 1 shows a portion of module substrate 10, having mounted thereon a plurality of integrated circuit devices 12, about each of which is an engineering change network schematically represented at 14. The engineering change networks 14 are substantially identical, and a portion of one network is shown in FIG. 2. With reference to this Figure, each network 14 includes a multitude of engineering change pads 16, a multitude of linking or connecting pads 20, a multitude of first leads 22 and a wiring sub-network 24, which in turn includes a multitude of second leads 26 and a multitude of third leads 30. Five engineering change pads are shown in FIG. 2 and referenced therein at 16-1, 16-2, 16-3, 16-4, and 16-5. Twenty connecting pads are shown in FIG. 2 and six of these are referenced at 20-1 through 20-6. FIG. 2 also shows twenty first leads, twenty second leads, and twenty third leads. Four of the first leads are referenced at 22-1 through 22-4, six of the second leads are referenced at 26-1 through 26-6, and four of the third leads are referenced at 30-1 through 30-4. FIG. 2 also schematically shows a multitude of device contact pads or terminals 32 of one of the integrated circuit devices 12, and four of these device terminals are specifically referenced at 32-1 through 32-4.

As shown in FIG. 1, each engineering change network extends completely around a respective one circuit device 12. Also, the engineering change pads 16 of each network 14 are arranged in four linear arrays, one along each of the four sides of the associated circuit device 12. These features are not necessary to the practice of this invention though; and, for example, a network 14 may extend along only two or three sides of a circuit device 12. In addition, preferably a multitude of dogbone pads, one of which is shown at 34 in FIG. 1, extend around each circuit device 12 and each network 14.

Figure 3:
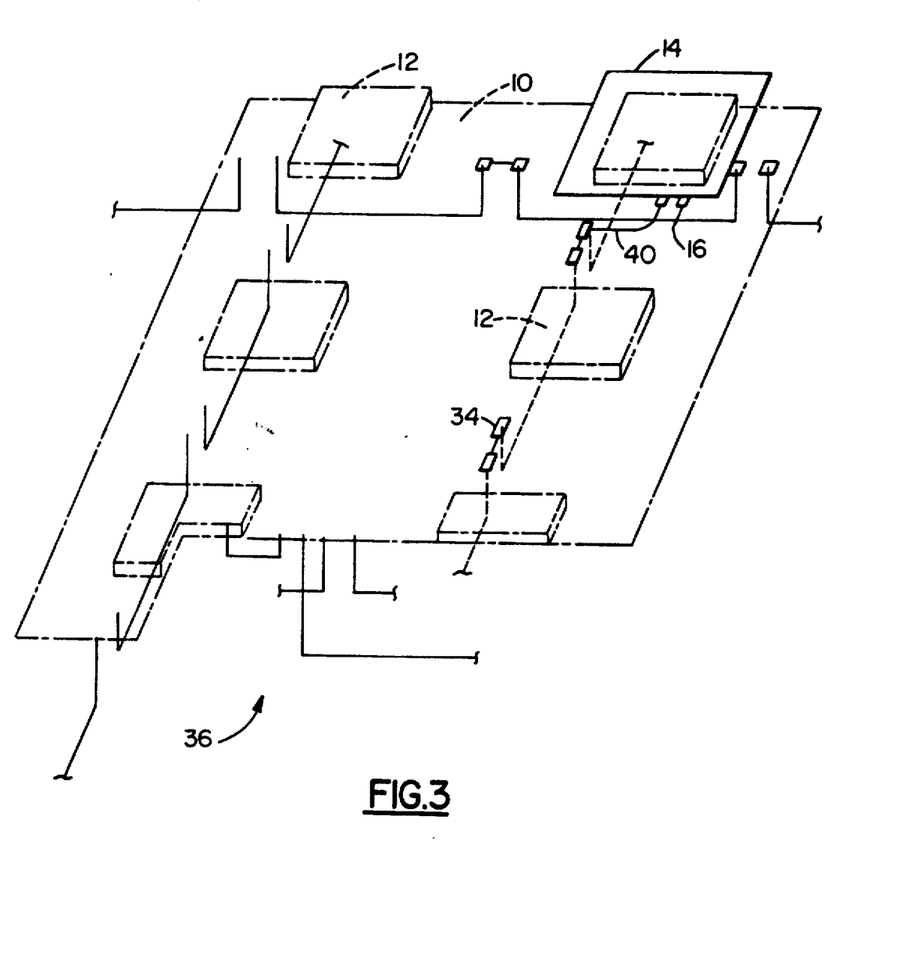
FIG. 3 is a schematic view in perspective that illustrates buried engineering change lines in the carrier of FIG. 1.

With particular regard to FIG. 3, also included in substrate 10 is an internal network 36 comprised of a multitude of buried engineering change lines in the x-direction, a multitude of buried engineering change lines in the y-direction, and a multitude of vias, which extend from these buried engineering change lines to the top surface of the substrate and which are connected to dogbone pads 34. Network 36 completes the interconnections between the device terminals of an integrated circuit device to the connecting pads, which were wire bonded to the dogbone pads, to other dogbone pads of a second integrated circuit device.

Substrate 10 is typically a multilayer ceramic substrate and may be, for example, of the type described in U.S. Pat. No. 4,245,273. Substrate 10 is comprised of a plurality of laminated ceramic sheets that have been punched to form holes for the vias, and in which conductive metal line patterns have been made to form the buried engineering change lines. The laminated sheet assembly is subsequently sintered to form a unitary substrate. Many suitable procedures are well known for forming a carrier, and the internal circuit network thereof, for integrated circuit devices, and any such procedure may be employed to manufacture substrate 10 and internal circuit network 36.

Figure 4:
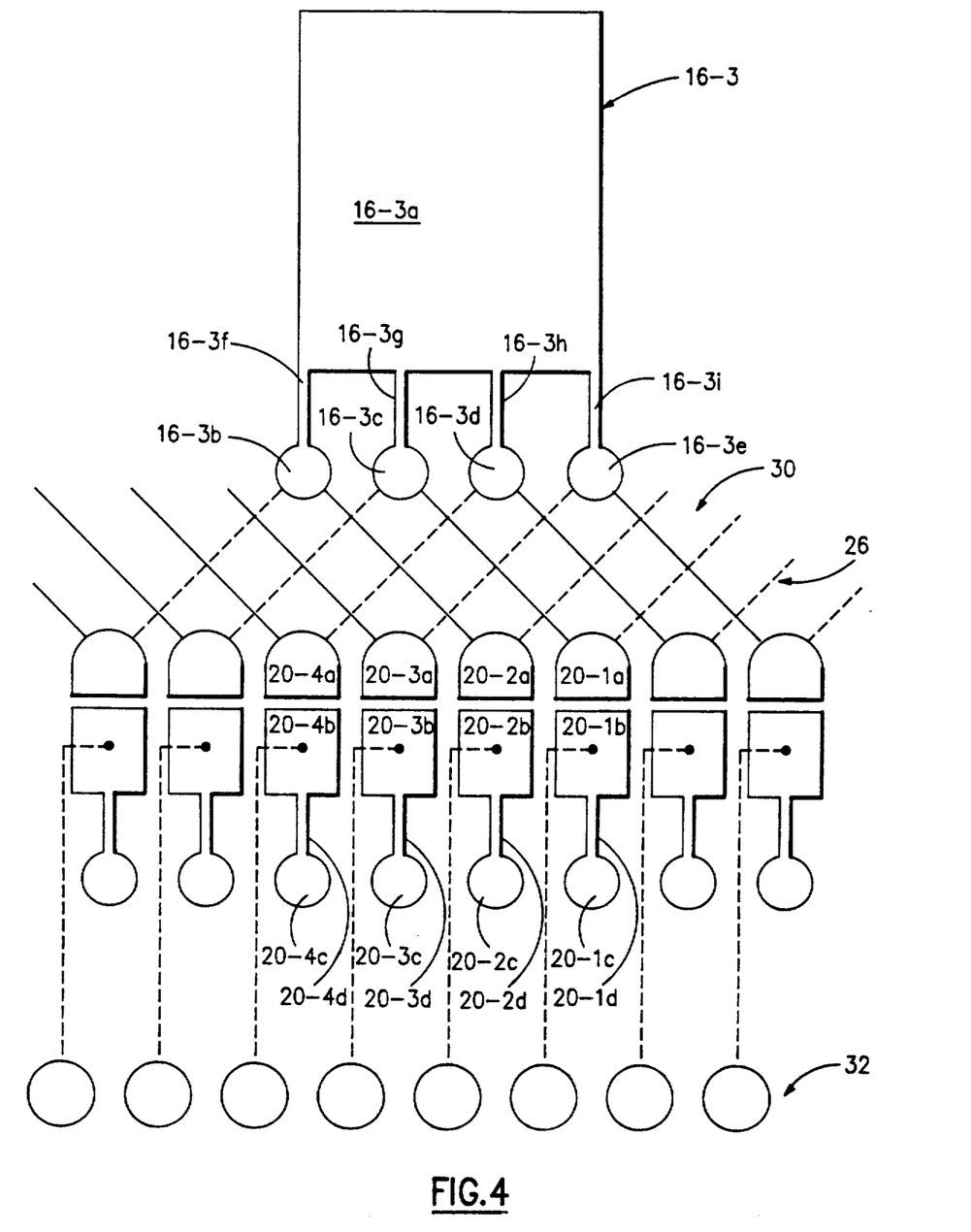
FIG. 4 is a still further enlarged view of a portion of FIG. 2.

The engineering change pads on substrate 10 are substantially identical and thus only one such pad, shown in FIG. 4, will be described herein in detail. Each engineering change pad includes a main bonding area or section, a plurality of input terminals, and a respective one lead connecting each input terminal of the pad to the main bonding area thereof. With the particular embodiment of the engineering pad shown in FIG. 4, each pad includes four input terminals, and hence, four connecting leads. In FIG. 4, the main bonding area of the engineering pad is identified by the same number as the pad, but with the added suffix "a," and the input terminals of the engineering pad are also identified by the same number as the pad, but with the added suffixes "b," "c," "d," and "e." Similarly, the connecting leads of the engineering pad shown in FIG. 4 are identified by the same number as the engineering pad, but with the added suffixes "f," "g," "h," and "i." Thus, for instance, lead 16-3f connects terminal 16-3b to bonding area 16-3a, and lead 16-3h connects terminal 16-3d to bonding area 16-3a.

Each linking pad 20 includes first, second, and third sections and a respective one lead connecting the third section of the pad to the second section thereof. In FIG. 4, the first, second, and third sections of each linking pad are identified by the same number as the linking pad, but with added suffixes "a," "b," and "c" respectively; and the connecting lead of each linking pad is identified by the same number as the linking pad, but with the added suffix "d." Thus, for example, lead 20-4d connects sections 20-4c and 20-4b of linking pad 20-4, and lead 20-1d connects sections 20-1c and 20-1b of linking pad 20-1. The first section of each linking pad is spaced from and is normally electrically disconnected from the second section of the linking pad; and the second and third sections of each linking pad are also spaced apart, but these two pads are normally electrically connected by the connecting lead of the linking pad.

With the preferred arrangement shown in FIG. 2, the linking pads of engineering change network 14 are positioned between the engineering change pads 16 and the device terminals 32. Moreover, the first section of each linking pad 20 is on the side of the pad toward the engineering change pads, the third section of the linking pad is on the side thereof toward the device terminals, and the second section of the linking pad is between the first and third sections thereof.

Each device terminal 32 is connected to a respective one linking pad 20, specifically the second section thereof, by one of the first leads 22 of network 14. For example, with reference to FIG. 2, device terminal 32-4 is connected to linking pad 20-4 by lead 22-4, and device terminal 32-2 is connected to linking pad 20-2 by lead 22-2. In addition, each linking pad, specifically the first section thereof, is connected to inlet terminals of two adjacent engineering change pads by a respective one of the second leads 26 and a respective one of the third leads 30; and each engineering change pad inlet terminal is connected to two linking pads 20, specifically the first sections thereof, by a respective one of the second leads and a respective one of the third leads. For instance, the first section of linking pad 20-4 is connected to one inlet terminal of pad 16-3 by lead 26-4 and to one inlet terminal of pad 16-2 by lead 30-4, and the first section of linking pad 20-1 is connected to one inlet terminal of engineering change pad 16-4 by lead 26-1, and to one inlet terminal of pad 16-3 by lead 30-1. Also, one inlet terminal of pad 16-3 is connected to linking pad 20-1 by lead 30-1 and to linking pad 20-5 by lead 26-5, and an inlet terminal of pad 16-2 is connected to linking pad 20-3 by lead 30-3 and to linking pad 20-6 by lead 26-6.

With the above-described arrangement, each linking pad is directly or indirectly connected to all of the engineering change pads of each network 14, and a unique electrically conductive path may be formed between each linking pad and each of the engineering change pads of the network. Further, each engineering change pad is directly connected to the number of linking pads equal to twice the number of inlet terminals of the engineering change pad.

Leads 22, 26, and 30 may be formed as a separate surface metallurgy layer with an isolating dielectric layer, these leads may be formed in the top surface layers of substrate 10, or as a combination thereof. It should be noted, though, that leads 26 are electrically insulated or separated from leads 30 as these two sets of leads cross over or under each other in the area between the engineering pads 16 and the connecting pads 20.

Moreover, the device terminals 32 are preferably solder wettable and the engineering change pads 16 are wire bondable. The device terminals are joined to terminals of the integrated circuit devices 12 by any suitable solder connection, for instance, as described in U.S. Pat. No. 3,429,040.

As previously mentioned, engineering change pads are provided to allow the circuitry of a modular substrate to be changed after that substrate has been made. Typically, heretofore, each device terminal was connected to a respective one engineering change pad, so that electrical access was available to each and every device terminal connection. The arrangement of the present invention provides the same results for all practical purposes even though the number of engineering change pads is less, and preferably substantially less, than the number of device terminals. This result is achieved by the multiplicity of possible electrically conductive pathways between each engineering change pad 16 and the device terminals 32. More specifically, connecting pads 20, leads 26 and 30, and the inlet terminals of the engineering change pads can be used to form a multitude of circuits to connect each of a multitude of adjacent device terminals to the main bonding area of a respective one engineering change pad despite the fact that there are fewer engineering change pads than device terminals.

To better illustrate the operation and advantages of the present invention, a specific example will be described in which four adjacent device terminals 32-1 through 32-4 are each connected to a respective one engineering change pad.

Figure 5:
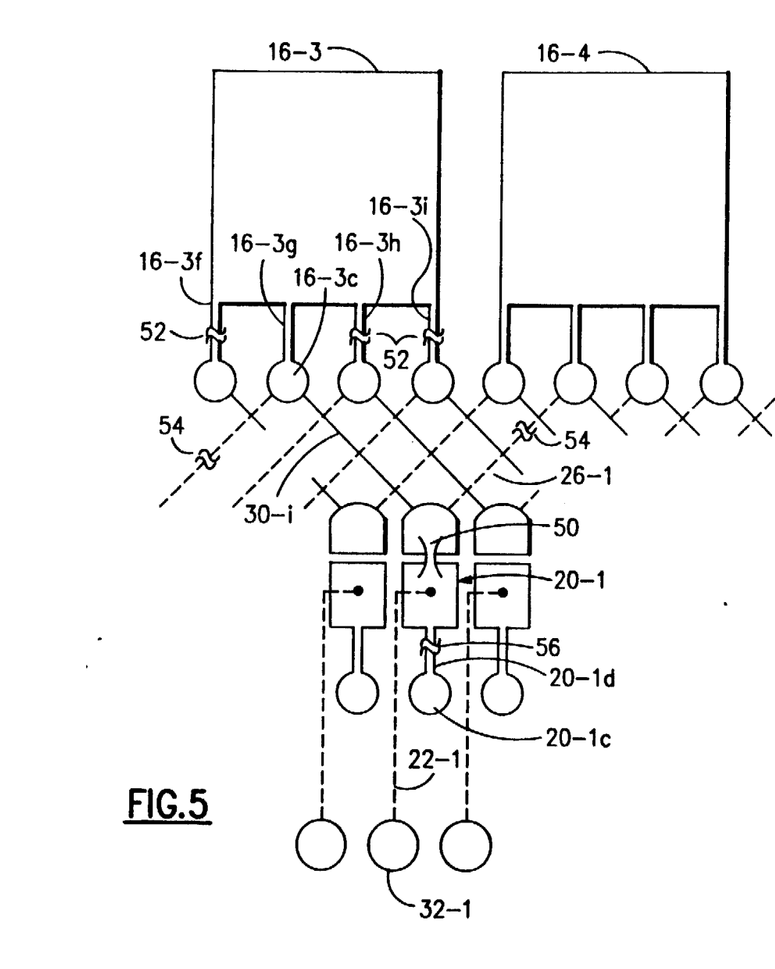
FIGS. 5–8 illustrate how various conductive pathways may be formed to connect each of four adjacent device terminals to a respective one engineering change pad.

With reference to FIGS. 2 and 5, device terminal 32-1 can be electrically connected to engineering change pad 16-3 by bridging the gap between the first and second sections of connecting pad 20-1 as shown at 50 in FIG. 5, thereby forming an electrically conducting pathway from terminal 32-1 to the bonding area 16-3a of change pad 16-3, comprising lead 22-1, the first and second sections of connecting pad 20-1, lead 30-1 and terminal 16-3c and lead 16-3g of change pad 16-3. Typically, it would be preferred to break or to sever the other leads 16-3f, 16-3h, and 16-3i of change pad 16-3, as shown at 52 in FIG. 5, and to break or sever leads 26-1 and 26-5, as shown at 54 in FIG. 5, to ensure that device terminal 32-1 is the only device terminal electrically connected to the bonding area of engineering change pad 16-3. It would also be preferred to break or sever lead 20-1d, as shown at 56 in FIG. 5, to separate device terminal 32-1 from the via connected to connecting pad section 20-1c of the internal network previously connected to the device terminal 32-1.

Figure 6:
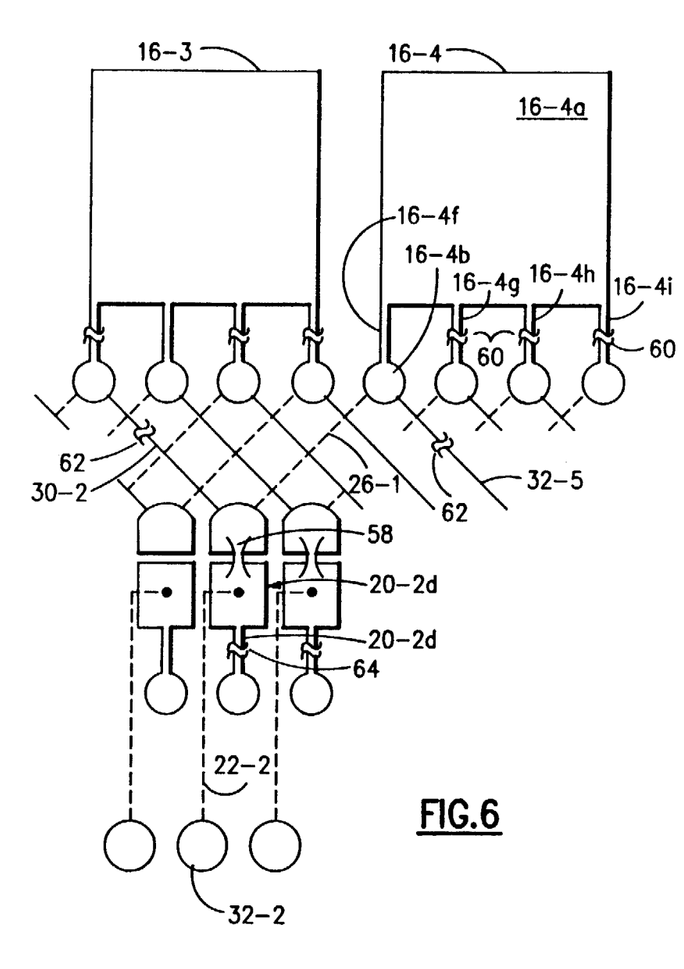

With reference to FIGS. 2 and 6, device terminal 32-2 can be electrically connected to engineering change pad 16-4 by bridging the gap between the first and second sections of connecting pad 20-2, as shown at 58 in FIG. 6, thereby forming an electrically conductive pathway from terminal 32-2 to bonding area 16-4a of change pad 16-4, comprising lead 22-2, the first and second sections of connecting pad 20-2, lead 26-1 and terminal 16-4b and lead 16-4f of change pad 16-4. Normally, it would be preferred to break the other leads 16-4g, 16-4h, and 16-4i of change pad 16-4, as shown at 60, and to break or sever leads 30-2 and 30-5 as shown at 62 in FIG. 6, to ensure that device terminal 32-2 is the only device terminal electrically connected to the main bonding area of engineering change pad 16-4. It would also be preferred to break lead 20-2d, as shown at 64 in FIG. 6, to separate terminal 32-2 from the via connected to connecting pad section 20-2c of the previously connected internal network.

Figure 7:
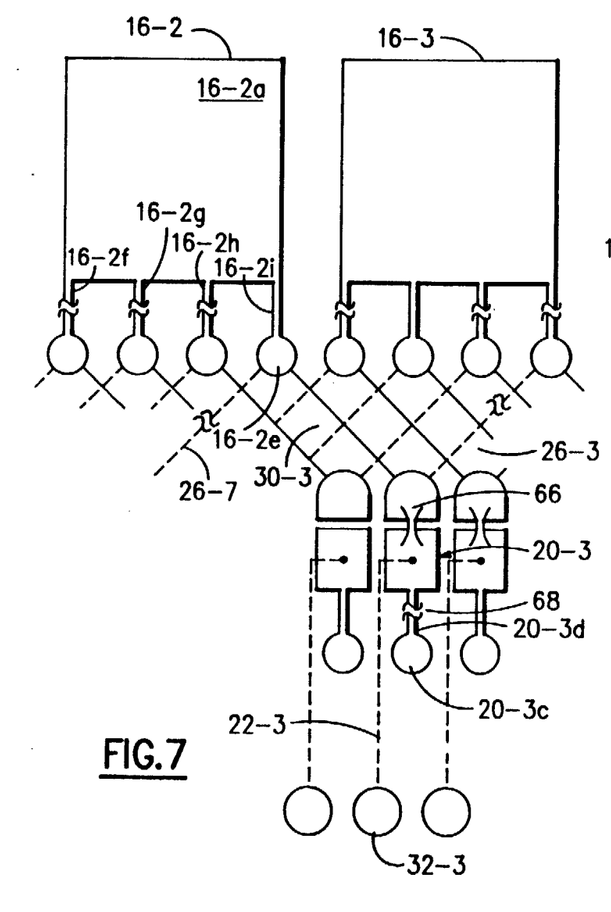

Similarly, with reference to FIGS. 2 and 7, device terminal 32-3 can be electrically connected to the bonding area of engineering change pad 16-2 by bridging the gap between the first and second sections of connecting pad 20-3, as shown at 66 in FIG. 7, thus forming an electrically conductive pathway between terminal 32-3 and the bonding area of engineering change pad 16-2, including lead 22-3, the first and second sections of connecting pad 20-3, lead 30-3, and terminal 16-2e and lead 16-2i of change pad 16-2. Preferably, leads 16-2f, 16-2g, and 16-2h of change pad 16-2 and leads 26-3 and 26-7 are all broken to ensure that device terminal 32-3 is the only device terminal electrically connected to the main bonding area of engineering change pad 16-2. Further, preferably lead 20-3d is broken, as shown at 68 in FIG. 7, to separate device terminal 32-3 from the via connected to connecting pad section 20-3c of the previously connected internal network.

Figure 8:
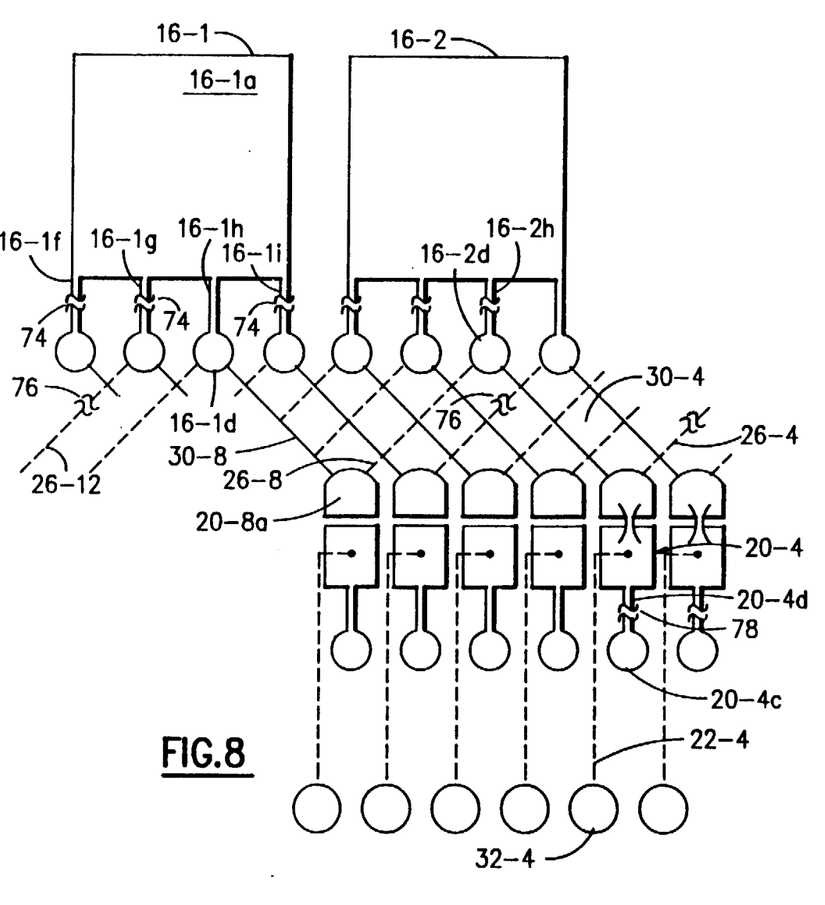

With reference to FIGS. 2 and 8, device terminal 32-4 is connected to engineering change pad 16-1 by bridging the gap between the first and second sections of connecting pad 20-4. Lead 16-2h of engineering change pad 16-2 has already been broken. This forms a circuit from device terminal 32-4 to the main bonding area of engineering change pad 16-1 comprised of lead 22-4, the first and second sections of connecting pad 20-4, lead 30-4, inlet terminal 16-2d of engineering change pad 16-2, lead 26-6, connecting pad section 20-5a, lead 30-5, and terminal 16-1d and lead 16-1h of engineering change pad 16-1. Preferably, leads 16-1f, 16-1g, and 16-1i are all broken, as shown at 74, and leads 26-4 and 26-8 are broken, as shown at 76 in FIG. 8, to ensure that device terminal 32-4 is the only device terminal electrically connected to the main bonding area of engineering change pad 16-1. Lead 20-4d is also broken, as shown at 78 in FIG. 8, to disconnect device terminal 32-4 from the via connected to connecting pad section 20-4c.

Any suitable procedures may be used to connect the first and second sections of the connecting pads 20, as shown at 50 in FIG. 5. For example, these sections may be electrically joined together by a solder connection. Likewise, any suitable means or method may be employed to sever the leads of engineering change network 14, as shown at 52 and 56 in FIG. 5; and, for instance, a laser may be used to sever these lines as desired. Moreover, it should be noted that it is not necessary to the practice of this invention that each of the terminals 32 be directly connected to a single one of the linking pads 20 when carrier 10 is made. For instance, when the carrier is made, each of the terminals 32 may be directly connected to none or to an arbitrary number of the linking pads 20; and when it is desired to make engineering changes, joints or deletes, of the type shown at 50 and 52, may be made to connect a given terminal 32 to a selected one of the linking pads 20.

As will be understood by those of ordinary skill in the art, not every device terminal on substrate 10 can be connected to a respective one engineering change pad, because there are fewer engineering change pads than device terminals. However, in any given modular circuit, not all of the device terminals need to be connected to engineering change pads; and assuming a randomness to the selection or choice of device terminals that need to be connected to engineering change pads, a standard statistical analysis shows that the arrangement of the present invention provides the necessary flexibility in virtually every case.

For example, on a circuit device having six hundred device terminals, typically only 40 to 100 of the device terminals would need to be connected to engineering change pads. A statistical analysis was performed for each of the situations in which 40, 60, 80, and 100 device terminals need to be reconnected via the engineering change pads. Of particular interest is the number of groups of various numbers of adjacent device terminals that need to be connected to engineering change pads, since a sizeable number of large groups of such terminals could cause wiring difficulties.

Given n objects, the number of ways of selecting m objects, without to order, can be expressed using the standard mathematical notation $(n_m)$, where $$\binom{n}{m} = \frac{n!}{m!(n-m)!} \quad (1)$$

If n is the total number of device terminals on the circuit devices, and m is the number of device terminals that would need to be reconnected, the number, r, of groups of $\alpha$ adjacent device pads (where $\alpha$ is a number between 2 and m), is:

$$r = n\binom{n-\alpha-2}{m-\alpha} \quad (2)$$

The general form for the sum, S, of all adjacencies is:

$$S = n\sum_{i=2}^{m}\binom{n-i-2}{m-i} \quad (3)$$

Another factor of interest is the number of no adjacencies that may be present. A no adjacency occurs when a device terminal that needs to be engineering changed is between two device terminals that do not need to be engineering changed. For example, if the device terminals are numbered 1 to 600 (with terminal 1 considered adjacent to terminal 600), a no adjacency would be present if device terminal 2 needs to be engineering changed, while device terminals 1 and 3 do not need to be engineering changed; and another no adjacency would occur if device terminal 4 also needs to be engineering changed, but device terminal 5 does not.

Again, if n is the total number of device terminals on a circuit, and m is the number of device terminals that need to be connected to engineering change pads, the number, j, of no adjacencies is given by the rule:

if $m > n/2$, then $j = 0$
if $m = n/2$, then $j = 2$
if $m < n/2$, then $j = \binom{n-m}{m} + \binom{n-m-1}{m-1}$ The probability of no adjacencies taken over all possible configurations is, $$q = j / \binom{n}{m} \quad (4)$$

Given the above, the probability of adjacency groupings can be computed as, $$p = \frac{r}{s} \cdot (1 - q) \quad (5)$$

Table I, below, summarizes the probabilities of adjacencies of various lengths occurring when the total number of device terminals is 600.

TABLE I

Probability of Adjacent Terminals Being Engineering Changed (for 600 Device Terminals)

| Adjacencies of | Total number of terminals being engineering changed | | | |
|---|---|---|---|---|
|  | 40 | 60 | 80 | 100 |
| 0 | 6.15% | 0.14% | 0.005% | 0.00% |
| 2 | 87.84% | 90.2% | 86.9% | 83.5% |
| 3 | 5.60% | 8.76% | 11.3% | 13.74% |
| 4 | 0.34% | 0.84% | 1.47% | 2.24% |
| 5 | 0.02% | 0.07% | 0.18% | 0.36% |

Thus, in all cases, the probability that a group of five adjacent device terminals would all need to be engineering changed is substantially less than 1%.

A verification test of this statistical analysis was conducted as follows. For a total of three hundred times, numbers were drawn at random from the number 1 to 600. In each of one hundred of these drawings, forty numbers were drawn; in each of a second hundred of the drawings, sixty numbers were drawn, and in each of the last one hundred drawings, eighty numbers were drawn. The number of times 0, 2, 3, 4, and 5 adjacencies occurred in each set of drawings are shown in Table II. Again, the number 600 is considered to be adjacent to the number 1.

TABLE II

Number and Maximum Occurrences of Selected Adjacencies in Test Drawings

|  | Adjacency of: | | | | |
|---|---|---|---|---|---|
|  | 0 | 2 | 3 | 4 | 5 |
| 100 sets of 40 drawn numbers | 6 | 228 | 14 | 1 | 0 |
| maximum in any one of the 100 sets | 1 | 7 | 1 | 1 | 0 |
| 100 sets of 60 drawn numbers | 0 | 487 | 38 | 3 | 0 |
| maximum in any one of the 100 sets | 0 | 9 | 2 | 1 | 0 |
| 100 sets of 80 drawn numbers | 0 | 737 | 105 | 17 | 3 |
| maximum in any one of the 100 sets | 0 | 17 | 4 | 2 | 1 |

This study shows that adjacencies of two or three are sufficiently few so that all the desired device terminals can be engineering changed without any wiring difficulties.

Table II shows that in the 100 sets of 40 randomly drawn numbers, only one group of four adjacent numbers were drawn. This adjacency is itself sufficiently isolated so that it is expected that there would be no difficulties in reconnecting 40 device terminals, and this result is consistent with Table I, which shows that the probability that four adjacent terminals would need to be engineering changed is 0.34%. In the 100 sets of 60 randomly drawn numbers, three groups of four adjacent numbers were drawn. However, this should not present any wiring difficulties.

In the 100 sets of 80 randomly drawn numbers, 17 groups of four adjacent numbers were drawn, and three groups of five adjacent numbers were drawn. Even in most cases of five adjacent numbers, each device terminal can be connected to a respective one engineering change pad by using connecting pads 20, leads 26 and 30, and the inlet terminals of the engineering change pads to form appropriate conductive paths between the device terminals and various engineering change pads. Even in those extremely rare cases in which each device terminal cannot be connected to a respective one engineering change pad via connecting pads 20, leads 26 and 30, and the inlet terminals of the engineering change pads, conventional jumper straps or wires to adjacent engineering change pads may be used to accomplish this. Wiring rules may be formulated to determine priority among the device terminals, or otherwise to ensure that each device terminal is connected to a respective one engineering change pad.

While it is apparent that the invention herein disclosed is well calculated to fulfill the objects previously stated, it will be appreciated that numerous modifications and embodiments may be devised by those skilled in the art, and it is intended that the appended claims cover all such modifications and embodiments as fall within the true spirit and scope of the present invention.

What is claimed is:

1. A structure comprising:
   a substrate having a first plurality of electrically conducting contact locations, and a second plurality of electrically conducting contact location, the number of said contact locations within said second plurality being less than number of said contact locations within said first plurality; and
   means for providing a unique electrical connection from each member of a selected subset of said contact locations of said first plurality of contact locations to one of said contact locations of said second plurality of contact locations, and including
   i) a third plurality of electrically conducting contact locations, the number of said contact locations within said third plurality of contact locations being equal to the number of contact locations within said first plurality of contact locations,
   ii) a first plurality of conductive leads, each of the first plurality of conductive leads electrically connecting one of the first plurality of contact locations with a respective one of the third plurality of contact locations, and
   iii) a wire assembly providing a unique electrical connection between each of the third plurality of contact locations and each of the second plurality of contact locations.

2. A structure according to claim 1, wherein said subset has a number of members at most equal to the number of members of said second plurality of contact locations.

3. A structure according to claim 1, wherein said wire assembly electrically connects each of the third contact locations with a plurality of the second contact locations, and electrically connects each of the second contact locations with a plurality of the third contact locations.

4. A structure according to claim 3, wherein said wire assembly includes a plurality of second conductive leads and a plurality of third conductive leads, said second conductive leads connecting each of the third contact locations with one of the second contact locations, said third conductive leads connecting each of the second contact locations with a plurality of the third contact locations.

5. A structure according to claim 4, wherein the second conductive leads and the third conductive leads are formed as a separate surface metallurgy layer on the substrate, or are formed in top surface layers of the substrate.

6. A structure according to claim 1, wherein:
each of the second contact locations includes a plurality of outlet terminals; and
the wire assembly electrically connects each of the third contact locations with one outlet terminal of one of the second contact locations and with one outlet terminal of another of the second contact locations, and electrically connects each of the outlet terminals of the second contact locations with a respective one pair of the third contact locations.

7. An integrated circuit carrier comprising:
a modular substrate having an upper surface;
a multitude of first, electrically conducting contact locations on the upper surface of the substrate;
a multitude of second, electrically conducting contact locations on the upper surface of the substrate; and
an engineering change network to form a unique electrical connection between each of an arbitrary subset of the first contact locations and each of an arbitrary subset of the second contact locations, and including
i) a multitude of third, electrically conducting contact locations on the upper surface of the substrate,
ii) a multitude of first conductive leads, each of said first leads connecting one of the first contact locations and a respective one of the third contact locations, and
iii) a wire assembly electrically connecting each of the third contact locations with a plurality of the second contact locations, and electrically connecting each of the second contact locations with a plurality of the third contact locations.

8. An integrated circuit carrier according to claim 7, wherein:
each of said third contact location includes first and second spaced apart sections;
each of said first leads connects one of the first contact locations and a first section of a respective one of the third contact locations;
a wire assembly forming a unique electrical connection between the second section of each third contact location and each of a plurality of the second contact locations.

9. A structure according to claim 8, wherein:
each of the second contact locations includes
i) a wire bonding area,
ii) a multitude of inlet terminals, and
iii) a multitude of second conductive leads, each of the inlet terminals being electrically connected to the wire bonding area by a respective one of the second conductive leads; and
the wire assembly includes a multitude of third conductive leads and a multitude of fourth conductive leads;
the second section of each third contact location is electrically connected to one of the second contact locations by a respective one of the third conductive leads, and to another of the second contact locations by a respective one of the fourth conductive leads; and
each inlet terminal is electrically connected to the second section of one of the third contact locations by a respective one of the third conductive leads, and to the second section of another of the third contact locations by a respective one of the fourth conductive leads.

10. An integrated circuit carrier according to claim 8, wherein:
each of the second contact locations includes a plurality of outlet terminals; and
the wire assembly electrically connects each of the third contact locations with one outlet terminal of one of the second contact locations and with one outlet terminal of another of the second contact locations, and electrically connects each of the outlet terminals of the second contact locations with a respective one pair of the third contact locations.

11. An integrated circuit carrier according to claim 7, wherein said wire assembly includes:
a plurality of second conductive leads electrically connecting each of the third contact locations with one of the second contact locations; and
a plurality of third conductive leads electrically connecting each of the second contact locations with a plurality of the third contact locations.

12. An integrated circuit carrier according to claim 11, wherein the second conductive leads and the third conductive leads are formed as a separate surface metallurgy layer on the substrate, or are formed in top surface layers of the substrate.

13. A method of altering the circuit design of an electronic module having a first multitude of electrically conductive device terminals, and a second multitude of electrically conductive engineering change pads, said second multitude being less than said first multitude, and each of the engineering change pads including a main bonding area, a multitude of inlet terminals and a multitude of first conductive leads, wherein each inlet terminal of each engineering change pad is connected to the main bonding area thereof by a respective one of the first conductive leads of the engineering change pad, the method comprising:
a) electrically connecting each device terminal to a respective one intermediate contact location; and
b) for each of an arbitrary subset of device terminals, electrically connecting each of the intermediate contact locations that are connected to said arbitrary subset of device terminals, to a respective one of the engineering change pads, including the steps of
i) electrically connecting each of the arbitrary subset of the device terminals to one of the inlet terminals of one of the engineering change pads, and
ii) for each of the other inlet terminals of said one engineering change pad, severing the first conductive lead connecting the other inlet terminal to the main bonding area of the engineering change pad to electrically isolate said main bonding area from all except said one inlet terminal.

14. A method according to claim 13, wherein each of the intermediate contact locations includes first and second spaced apart sections, and step (b) includes the step of electrically connecting together the first and second sections of each of the intermediate contact locations that are connected to the arbitrary subset of device terminals.

15. A method according to claim 14, wherein the module further includes a multitude of second connecting leads electrically connecting the second section of each of the intermediate contact locations to two of the engineering change pads.

16. A method according to claim 13, wherein the electronic module further includes an internal engineering change network, and step (b) includes electrically connecting each of selected ones of the arbitrary subset of device terminals to another of the multitude of device terminals by means of the internal engineering change network.

* * * * *